United States Patent
Vashchenko et al.

(10) Patent No.: US 6,407,445 B1
(45) Date of Patent: Jun. 18, 2002

(54) MOSFET-BASED ELECTROSTATIC DISCHARGE (ESD) PROTECTION STRUCTURE WITH A FLOATING HEAT SINK

(75) Inventors: Vladislav Vashchenko, Fremont; Peter J. Hopper, San Jose, both of CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/680,580

(22) Filed: Oct. 6, 2000

(51) Int. Cl.[7] .............................................. H01L 23/58
(52) U.S. Cl. ...................................................... 257/630
(58) Field of Search ................................. 257/630–634, 257/499, 506, 508

(56) References Cited

U.S. PATENT DOCUMENTS 5,828,120 A * 10/1998 Ishikawa ..................... 257/499

* cited by examiner

*Primary Examiner*—Howard Weiss
*Assistant Examiner*—(Vikki) Hoa Trinh
(74) *Attorney, Agent, or Firm*—Pillsbury Winthrop LLP

(57) ABSTRACT

A MOSFET-based ESD protection structure for use in MOS ICs that is relatively immune to thermal overheating during an ESD event. This immunity is achieved by employing a floating heat sink to dissipate heat generation during the ESD event. The structure includes a semiconductor substrate (e.g., a silicon substrate) of a first conductivity type (typically P-type) with a gate insulation layer (e.g., a gate silicon dioxide layer) thereon. A patterned gate layer (e.g., a patterned polysilicon gate layer) overlies the gate insulation layer. Also included are source and drain regions of a second conductivity type disposed in the semiconductor substrate. The structure further includes a floating heat sink disposed above, and in contact with, the drain region, and an interconnect dielectric layer disposed over the semiconductor substrate, the source region, the patterned gate layer and the drain region. The floating heat sink is formed of a material with a heat capacity and/or thermal conductivity that is greater than the heat capacity and/or, thermal conductivity of the material (typically $SiO_2$-based) which constitutes the interconnect dielectric layer. For example, the floating heat sink is formed of metal and/or polysilicon. The floating heat sink is disposed above, and in contact with, the drain region since this location is near (i.e., within approximately 2 microns of) the point of maximum temperature generation during an ESD event. The floating nature of the heat sink insures that electrical behavior of the remainder of the structure is essentially unaltered by its presence.

27 Claims, 2 Drawing Sheets

MOSFET-BASED ELECTROSTATIC DISCHARGE (ESD) PROTECTION STRUCTURE WITH A FLOATING HEAT SINK

BACKGROUND OF THE INVENTION

1. Field of the Invention

The present invention relates to semiconductor device structures and, in particular, to electrostatic discharge protection structures for use with integrated circuits.

2. Description of the Related Art

Electrostatic discharge (ESD) protection devices are commonly employed in an integrated circuit (IC) to protect electronic devices in the IC from spurious pulses of excessive voltage (e.g., an ESD event, Human Body Model [HBM] event, or Electrical Overstress [EOS] event). See, for example, S.M. Sze, *Electrostatic Discharge Damage*, in VLSI Technology, Second Edition, 648–650 (McGraw Hill, 1988). A variety of conventional ESD protection devices that make extensive use of diodes, metal-oxide-semiconductor field effect transistors (MOSFETs), and bipolar transistors are known in the field. For example, conventional ESD protection devices for use with CMOS integrated circuits include Grounded-Gate MOS (GGMOS) ESD protection structures and Low Voltage Silicon Controlled Rectifier (LVSCR) ESD protection structures. Descriptions of these and other conventional ESD protection structures are available in Haigang, et al., *A Comparison Study of ESD Protection for RFICs: Performance vs. Parasitics*, 2000 IEEE Radio Frequency Integrated Circuits Symposium, 235–237 (2000); U.S. patent application for "MOSFET Structure For Use in ESD Protection Devices" (filed Jul. 17, 2000; application number not yet assigned) and U.S. patent application Ser. No. 09/205,110 (filed Dec. 3, 1998), each of which is hereby fully incorporated by reference.

Referring to FIG. 1, a representative conventional MOSFET-based ESD protection structure 10 for use with CMOS ICs is illustrated. The MOSFET-based ESD protection structure 10 includes a gate silicon dioxide ($SiO_2$) layer 12 overlying a P-type silicon substrate 14. Also present in the P-type silicon substrate 14 are N-type source region 16 and N-type drain region 18. Channel region 20 is located in the P-type silicon substrate 14 and connects the N-type source region 16 to the N-type drain region 18 underneath the gate silicon dioxide layer 12. A patterned polysilicon gate layer 22 overlies gate silicon dioxide layer 12. Gate sidewall spacer 24, typically of silicon dioxide or silicon nitride, is formed on lateral surfaces of the patterned polysilicon gate layer 22 and gate silicon dioxide layer 12.

Conventional MOSFET-based ESD protection structure 10 also includes an interconnect dielectric layer 26 (typically a silicon dioxide [$SiO_2$] based layer) overlying the P-type silicon substrate 14, N-type source region 16, gate sidewall spacer 24, patterned polysilicon gate layer 22 and N-type drain region 18. Substrate contact 28, source region contact 30, gate contact 32 and drain region contact 34, each formed through interconnect dielectric layer 26, are also present in conventional MOSFET-based ESD protection structure 10. Substrate contact 28, source region contact 30, gate contact 32 and drain region contact 34 are typically formed of one or more metallic layers (e.g., aluminum, an aluminum alloy, titanium, and/or titanium-nitride). An electrical schematic illustrating conventional MOSFET-based ESD protection structure 10 of FIG. 1 arranged in a basic conventional GGMOS ESD protection configuration is provided in FIG. 2.

Conventional MOSFET structures are designed to exhibit breakdown characteristics only at voltages well above their standard operating supply voltage. However, during an ESD event, conventional MOSFET-based structures used in ESD protection devices exhibit significant current conduction via a parasitic lateral bipolar mechanism. For a further description of such current conduction in MOSFET-based structures via a parasitic lateral bipolar mechanism, see E. A. Amerasekera et al., *ESD in Silicon Integrated Circuits*, sections 3.5.2 and 4.2.3. (John Wiley & Sons, 1995), which are hereby fully incorporated by reference.

A significant physical limitation of conventional MOSFET-based ESD protection structures is their susceptibility to thermal overheating and associated irreversible damage (e.g., local melting). As a consequence, conventional MOSFET-based ESD protection structures are unstable in the event that a critical temperature of approximately 1300° K is reached during an ESD event. Still needed in the field, therefore, is an ESD protection structure for use in MOS ICs that is relatively immune to thermal overheating and, thus, stable during an ESD event.

SUMMARY OF THE INVENTION

The present invention provides a MOSFET-based ESD protection structure for use in MOS ICs that is relatively immune to thermal overheating and, thus, stable during an ESD event. Immunity to thermal overheating and, thereby, stability during an ESD event are attained in the present invention by employing a floating heat sink to dissipate the heat generated during such an ESD event.

MOSFET-based ESD protection structures according to the present invention include a semiconductor substrate (e.g., a silicon substrate) of a first conductivity type (typically P-type) with a gate insulation layer (e.g., a gate silicon dioxide layer) thereon. The gate insulation layer underlies a patterned gate layer. Also included are a source region and drain region of a second conductivity type, each disposed in the semiconductor substrate, as well as a floating heat sink disposed above, and in contact with, the drain region. An interconnect dielectric layer is disposed over the semiconductor substrate, the source region, the patterned gate layer and the drain region.

The floating heat sink is formed of a material with a heat capacity and/or thermal conductivity that is greater than the heat capacity and/or thermal conductivity of the material (typically an $SiO_2$-based material) which constitutes the interconnect dielectric layer. Therefore, the floating heat sink can be formed of metal (e.g., aluminum, and aluminum alloy, or copper) and/or polysilicon. The floating heat sink is disposed above, and in contact with, the drain region since this location is near (i.e., within approximately 2 microns, and preferably within 1.5 microns, of) the point of maximum temperature generation during a transitory ESD event (e.g., a 10 nano-second rising and 150 nano-second falling MIL standard HBM event). The electrically floating nature of the floating heat sink insures that the electrical behavior (e.g., I-V characteristics and transients) of the remainder of the MOSFET-based ESD protection structure is essentially unaltered by its presence.

MOSFET-based ESD protection structures according to the present invention can be thought of as a variant of an MOS snap-back ESD protection structure with the distinctive addition of a floating heat sink within 2 microns of the point of maximum temperature generation during a transitory ESD event. The floating heat sink provides immunity to overheating and, consequently, superior ESD protection performance.

BRIEF DESCRIPTION OF THE DRAWINGS

A better understanding of the features and advantages of the present invention will be obtained by reference to the following detailed description that sets forth illustrative embodiments, in which the principles of the invention are utilized, and the accompanying drawings (in which like numerals, are used to designate like elements), of which.

DETAILED DESCRIPTION OF THE INVENTION

To be consistent throughout the present specification and for clear understanding of the present invention, the following definitions are provided for terms used therein:

The terms "dopant" and "dopants" refer to donor and acceptor impurity atoms (e.g., boron [B], phosphorous [P], arsenic [As] and indium [In]), which are intentionally introduced into a semiconductor substrate (e.g., a silicon wafer) in order to change the substrate's charge-carrier concentration. See, R. S. Muller and T. I. Kamins, *Device Electronics for Integrated Circuits* 2nd Edition, 11–14 (John Wiley and Sons, 1986) for a further description of dopants.

The term "floating," when used in reference to a heat sink, refers to the absence of a direct electrical connection (i.e., a contact) to the heat sink, although the heat sink can be, for example, in contact with a drain region or a metal salicide layer on a drain region.

Figure 3:
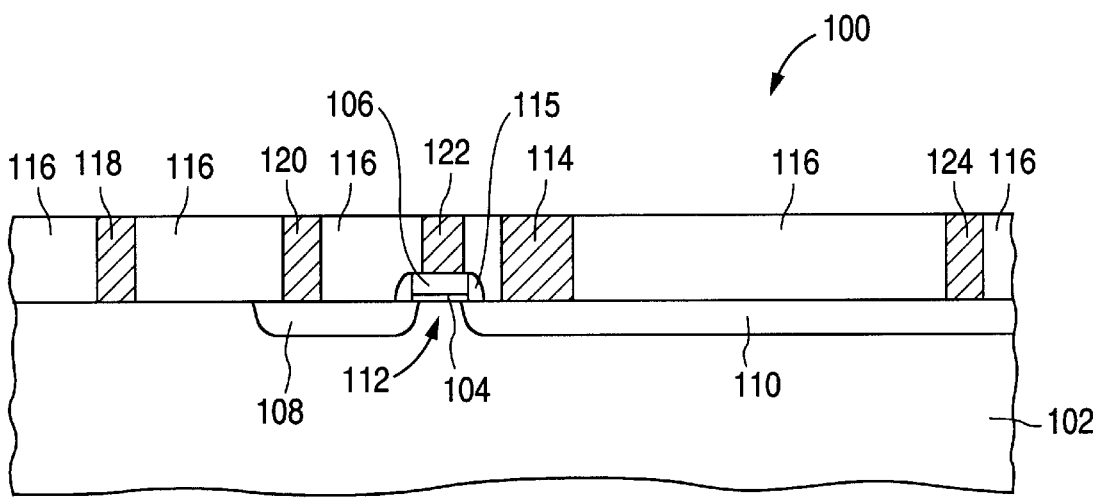
FIG. 3 is a cross-sectional view of a MOSFET-based ESD protection structure according to the present invention.

FIG. 3 illustrates a MOSFET-based ESD protection structure 100 for use with MOS ICs according to the present invention. MOSFET-based ESD protection structure 100 includes a P-type semiconductor substrate 102 (e.g., a silicon substrate). The dopant level in the semiconductor substrate can be any conventional level known in the art. MOSFET-based ESD protection structure 100 also includes a gate insulation layer 104 (typically a gate silicon dioxide [$SiO_2$] layer, although other gate insulating layers known in the art can be employed) on the P-type semiconductor substrate 102 and a patterned gate layer 106 overlying the gate insulation layer 104. Gate insulation layer 104 can be formed using conventional techniques, such as thermal oxidation. The patterned gate layer 106 can be formed of, for example, either amorphous silicon or polysilicon using conventional deposition and patterning techniques.

MOSFET-based ESD protection structure 100 also includes an N-type source region 108 and an N-type drain region 110, both disposed in the P-type semiconductor substrate 102. While the width and net dopant level of the N-type source and drain regions 108, 110 are technology dependent, a typical width is approximately 1.2 microns for the N-type source region 108 and greater than 7 microns for the N-type drain region 110. One skilled in the art will recognize that the width of the N-type drain region 110 can be predetermined such that the N-type drain region functions as a ballast resistor during an ESD event. Typical net dopant concentrations for the N-type source and drain regions 108 and 110 are in the range of 1E15 to 1E20 atoms per $cm^3$. The N-type source and drain regions 108, 110 can be formed using conventional ion implantation and thermal annealing techniques.

MOSFET-based ESD protection structure 100 further includes a P-type channel region 112 disposed in the P-type semiconductor substrate 102 underneath the gate insulation layer 104 and extending from the N-type source region 108 to the N-type drain region 110. If desired, the MOSFET-based ESD protection structure 100 can also include a gate sidewall spacer 115 which abuts the sides of patterned gate layer 106 and gate insulation layer 104. The gate sidewall spacer 115 can be made, for example, of CVD silicon nitride, silicon dioxide, or combination of silicon nitride and silicon dioxide, and have a typical width (measured at the bottom of the gate sidewall spacer 115) in the range of 500 angstroms to 1000 angstroms.

MOSFET-based ESD protection structure 100 also includes a floating heat sink 114 disposed over and in contact with the N-type drain region 110. During a transitory ESD event, significant heat is propagated only a relatively short distance (i.e., on the order of 1 to 2 microns). The floating hear sink 114 is, therefore, disposed within a distance of no more than 2.0 microns (and preferably 1.5 microns) from a point of maximum temperature generation during an ESD event. For a MOSFET-based ESD protection structure, the point of maximum temperature generation is typically in the drain region 110 immediately underneath the gate sidewall spacer 115. The heat dissipation efficiency of the floating heat sink 114 is increased as the distance to the point of maximum temperature generation is decreased.

Also included in MOSFET-based ESD protection structure 100 are an interconnect dielectric layer 116 (typically a silicon dioxide [$SiO_2$] based layer) overlying the P-type semiconductor substrate 102, the N-type source region 108, the gate sidewall spacer 115, the patterned gate layer 106 and the N-type drain region 110. Substrate contact 118, source region contact 120, gate contact 122 and drain region contact 124, each formed through the interconnect dielectric layer 116, are also present in MOSFET-based ESD protection structure 100. The substrate contact 118, the source region contact 120, the gate contact 122 and the drain region contact 124 are typically formed of one or more metallic layers (e.g., aluminum, an aluminum alloy, titanium, and/or titanium-nitride).

Interconnect dielectric layers have poor (i.e., relatively low) heat capacities and thermal conductivities and, therefore, provide essentially no heat sink benefits during a transitory ESD event. Rather, interconnect dielectric layers tend to act as heat reflectors that force heat propagation to occur in the more thermally conductive regions that lie below the interconnect dielectric layer. However, in MOSFET-based ESD protection structures according to the present invention, floating heat sink 114 is adapted to provide an additional and highly efficient means for dissipating heat generated during a transitory ESD event. The floating heat sink 114 is, therefore, formed of a material with a heat capacitance and/or thermal conductivity that is superior to that of the interconnect dielectric layer 116. For example, the floating heat sink 114 can be formed of a metal or metallic compound (e.g., aluminum, an aluminum alloy, copper, titanium, titanium nitride, or a layered combination thereof) and/or silicon (e.g., polysilicon or epitaxial silicon).

It can be desirable to provide a metal salicide layer (not shown) on the N-type source region 108 and the N-type drain region 110 in a manner that is known to one skilled in the art. In that circumstance, the floating heat sink 114 is disposed above the N-type drain region 110 and in contact with the N-type drain region 110 via the metal salicide layer. Such a metal salicide layer can be, for example, a cobalt salicide or a titanium salicide layer.

Figure 4:
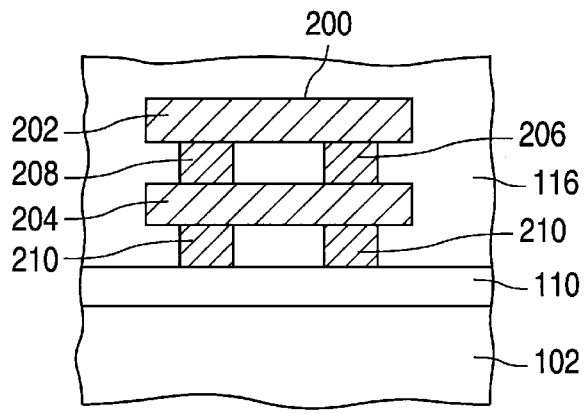
FIG. 4 is a cross-sectional view of a floating heat sink for use in a MOSFET-based ESD protection structure according to the present invention.

Although the floating heat sink 114 of FIG. 3 has a rectangular cross-sectional shape, other cross-sectional shapes are also capable of providing the requisite heat dissipation capability. A floating heat sink can, for example, be formed of a plurality of interconnected metal layers. FIG. 4 illustrates a floating heat sink 200 that includes interconnected 0.35 micron thick metal layers 202, 204, 0.35 micron wide via-like structures 206, 208, and 0.35 micron wide contact-like structures 210, 212. In such an embodiment, the overall width of the floating heat sink 200 is approximately 1 micron, while the overall height is approximately 1.4 microns. Since the floating heat sink 200 is made up of metal layers, contacts and vias that are already part of conventional manufacturing processes, it can be easily integrated into such processes.

Figure 1:
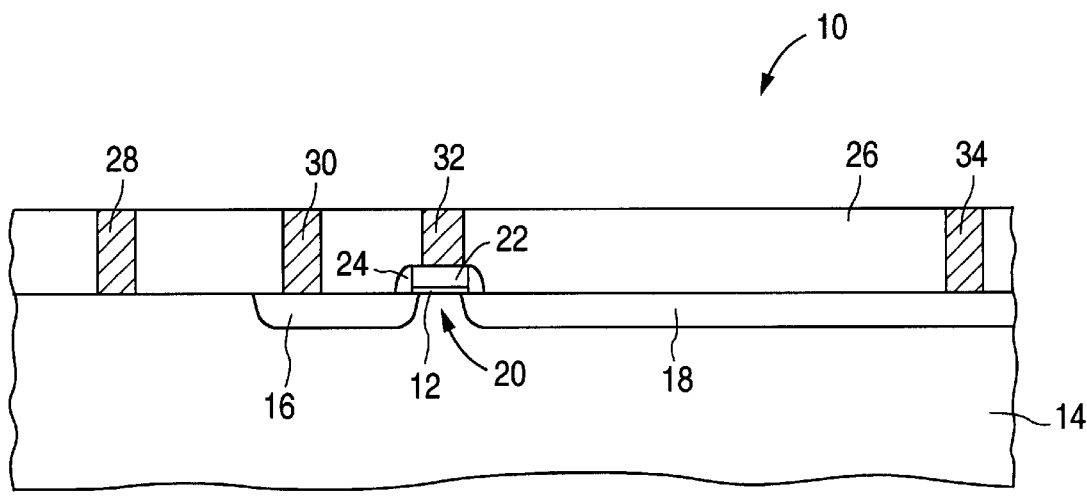
FIG. 1 is a cross-sectional view of a conventional MOSFET-based ESD protection structure.
Figure 2:
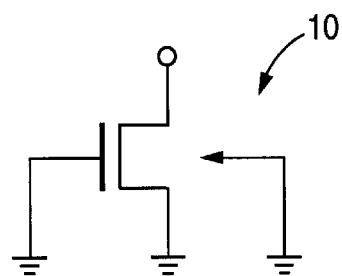
FIG. 2 is an electrical schematic illustrating a conventional MOSFET-based ESD protection structure in a grounded-gate configuration.
Figure 5:
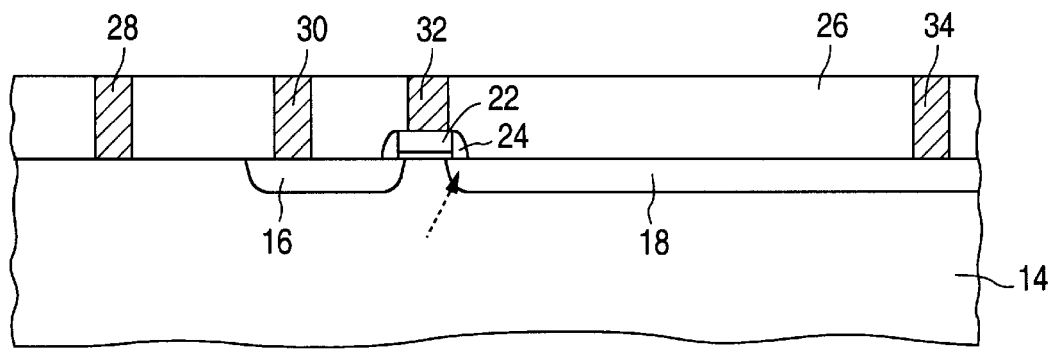
FIG. 5 is a cross-sectional view of the conventional MOSFET-based ESD protection structure of FIG. 1 with the point of maximum temperature generation during an ESD event marked by a dashed arrow.

FIG. 5 is a cross-sectional view of the conventional MOSFET-based ESD protection structure of FIG. 1 with the point of maximum temperature generation at 73 seconds into a 1.5 kV HBM event marked by a dashed arrow. The temperature at this point is 1700° K. The heat generated during such an ESD event is pulse-like, rather than steady-state. The heat is, therefore, propagated only a short distance (approximately 1 to 2 microns). It is for this reason that the floating heat sink in MOSFET-based ESD protection structure according to the present invention is disposed above and in contact with the N-type drain region and within 2 microns (and preferably within 1.5 microns or less) of the point of maximum temperature generation.

Figure 6:
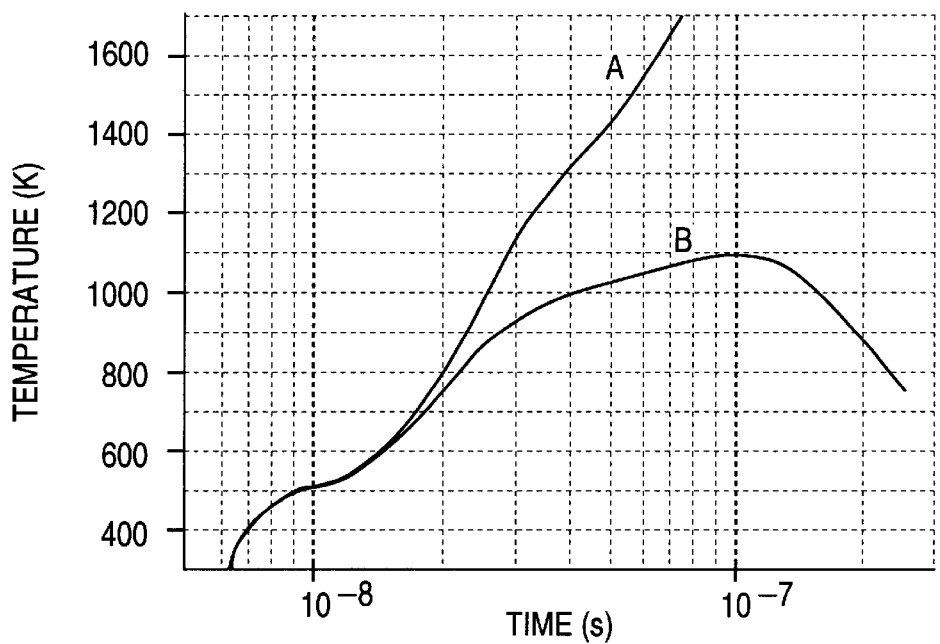
FIG. 6 is a graph of temperature versus time from a numerical simulation that illustrates the thermal behavior of a 50 micron conventional MOSFET-based ESD protection structure formed using a 0.18 micron CMOS process technology (curve A) and a 50 micron MOSFET-based ESD protection structure with an approximately 0.1 micron wide and 1 micron high floating aluminum heat sink according to the present invention (curve B), formed using the same 0.18 micron CMOS process technology.

FIG. 6 is a graph of maximum temperature versus time illustrating the thermal behavior of a conventional 50 micron long MOSFET-based ESD protection structure formed using a 0.18 micron CMOS process technology (curve A) and a 50 micron long MOSFET-based ESD protection structure with an approximately 0.1 micron wide and 1 micron high floating aluminum heat sink according to the present invention (curve B) formed using the same 0.18 micron CMOS process technology. The data represented in FIG. 6 were obtained by solving the appropriate HBM pulse (1.5 kV for 10 nanoseconds) transport and thermal conductivity equations for configurations wherein the patterned gate layer is grounded through a resistor.

FIG. 6 suggests that the conventional MOSFET-based ESD protection device would attain a maximum temperature of approximately 1700° K. This temperature is well above the critical temperature of approximately 1300° K. As a consequence, the conventional MOSFET-based ESD protection device would be destroyed. FIG. 6 also suggests that the MOSFET-based ESD protection structure according to the present invention would only attain a maximum temperature of approximately 1100° K, well below the critical temperature of 1300° K.

Compared to the conventional MOSFET-based ESD protection structure, the maximum temperature generation during an ESD event in the MOSFET-based ESD protection structure according to the present invention is 45% lower and, consequently, an associated improvement in ESD protection capability is expected. MOSFET-based ESD protection structures according to the present invention can, therefore, provide reliable ESD protection for ESD events of higher amplitude than conventional structures or provide equivalent ESD protection with a smaller structure. They can also be arranged in any known configuration, including MOSFET gate-coupled and MOSFET gate-grounded configurations.

It should be understood that various alternatives to the embodiments of the invention described herein may be employed in practicing the invention. It is intended that the following claims define the scope of the invention and that structures within the scope of these claims and their equivalents be covered thereby.

What is claimed is:

1. A MOSFET-based ESD protection structure comprising:
    a semiconductor substrate of a first conductivity type;
    a gate insulation layer on the semiconductor substrate;
    a gate overlying the gate insulation layer, the gate having a side wall;
    a source region and a drain region of a second conductivity type disposed in the semiconductor substrate;
    a spacer formed to contact the side wall of the gate, and over a portion of the drain region;
    a floating heat sink disposed above, and in contact with, the drain region, the floating heat sink being disposed within a positive non-zero distance of less than 2 microns from a point in the drain region under the spacer; and
    an interconnect dielectric layer disposed over the semiconductor substrate, the source region, the patterned gate layer and the drain region.

2. The MOSFET-based ESD protection structure of claim 1, wherein the first conductivity type is P-type and the second conductivity type is N-type.

3. The MOSFET-based ESD protection structure of claim 1 arranged in a grounded-gate configuration.

4. The MOSFET-based ESD protection structure of claim 1, wherein the floating heat sink is formed of polysilicon.

5. The MOSFET-based ESD protection structure of claim 1, wherein the floating heat sink is formed of a plurality of interconnected metal layers.

6. An ESD protection device comprising:
    a grounded-gate MOSFET including:
        a semiconductor substrate of a first conductivity type;
        a gate insulation layer on the semiconductor substrate;
        a gate overlying the gate insulation layer, the gate having a side wall; and
        a source region and a drain region of a second conductivity type disposed in the semiconductor substrate;
    a spacer formed to contact the side wall of the gate, and over a portion of the drain region;
    a channel region of the first conductivity type disposed in the semiconductor substrate underneath the gate insulation layer and extending from the source region to the drain region, and
    a floating heat sink disposed within a positive non-zero distance of less than 2 microns from a point in the drain region under the spacer.

7. The ESD protection device of claim 6, wherein the floating heat sink is formed of metal.

8. An electrostatic discharge device formed in a semiconductor material, the device comprising:

spaced-apart source and drain regions formed in the semiconductor material;

a channel region located between the source and drain regions;

an insulation layer formed on the substrate material over the channel region;

a gate formed over the channel region on the gate insulation layer;

a first layer of dielectric material formed over the source region, the gate, and the drain region;

a heat sink, the heat sink having a heat sink contact formed through the first layer of dielectric material over the drain region, the heat sink contact being electrically connected to the drain region; and a drain contact formed through the first layer of dielectric material over the drain region, the drain contact being electrically connected to the drain region, the heat sink contact and the drain contact being spaced apart.

9. The device of claim 8 wherein the heat sink further includes a first trace formed on the layer of dielectric material and the over the heat sink contact.

10. The device of claim 9 wherein the first trace is not formed over the drain contact.

11. The device of claim 10 wherein the first trace is electrically connected to the heat sink contact.

12. The device of claim 9 wherein the first trace is electrically connected to the heat sink contact.

13. The device of claim 8 wherein the heat sink contact is positioned between the gate and the drain contact.

14. The device of claim 9 wherein the heat sink further comprises:

a second layer of dielectric material formed on the first layer of dielectric material and the first trace;

a via formed through the second layer of dielectric material to make an electrical contact with the first trace; and a second trace formed on the second layer of dielectric material to make an electrical contact with the via.

15. The device of claim 14 wherein the first trace is not formed over the drain contact.

16. The device of claim 15 wherein the first trace is electrically connected to the heat sink contact.

17. The device of claim 8 wherein the heat sink has a single electrical connection, the single electrical connection being to the drain region.

18. The device of claim 8 wherein the gate is electrically connected to the source region.

19. The device of claim 8 wherein the heat sink contact includes a plurality of metal layers.

20. The device of claim 8 wherein the source region has a width and the drain region has a width that is substantially greater than the width of the source region.

21. An electrostatic discharge device formed in a semiconductor material, the device comprising:

spaced-apart source and drain regions formed in the semiconductor material;

a channel region located between the source and drain regions;

an insulation layer formed on the substrate material over the channel region;

a gate formed over the channel region on the gate insulation layer;

a layer of dielectric material formed over the source region, the gate, and the drain region, the layer of dielectric material having a thermal conductivity;

a heat sink contact formed through the layer of dielectric material over the drain region, the heat sink contact having a thermal conductivity that is substantially greater than the thermal conductivity of the layer of dielectric material; and a drain contact formed through the layer of dielectric material over the drain region, the drain contact being electrically connected to the drain region, the heat sink contact and the drain contact being spaced apart.

22. The device of claim 21 wherein the device further includes a trace formed on the layer of dielectric material and over the heat sink contact.

23. The device of claim 22 wherein the trace is not formed over the drain contact.

24. The device of claim 21 wherein the heat sink contact is positioned between the gate and the drain contact.

25. The device of claim 21 wherein the heat sink contact has a single electrical connection, the single electrical connection being to the drain region.

26. The device of claim 21 wherein the gate is electrically connected to the source region.

27. The device of claim 21 wherein the source region has a width and the drain region has a width that is substantially greater than the width of the source region.

* * * * *